United States Patent
Park

(10) Patent No.: US 7,022,569 B2
(45) Date of Patent: Apr. 4, 2006

(54) LOWER ELECTRODE CONTACT STRUCTURE AND METHOD OF FORMING THE SAME

(75) Inventor: Jeong-Ju Park, Suwon-si (KR) THE SAME

(73) Assignee: Samsung Electronics Co., Ltd., Suwon-si (KR) THE SAME ( * ) Notice: Subject to any disclaimer, the term of this patent is extended or adjusted under 35 U.S.C. 154(b) by 2 days. THE SAME

(21) Appl. No.: 11/000,943

(22) Filed: Dec. 2, 2004

(65) Prior Publication Data

US 2005/0095782 A1 May 5, 2005 THE SAME

Related U.S. Application Data

(62) Division of application No. 10/634,898, filed on Aug. 6, 2003, now Pat. No. 6,861,690. THE SAME

(30) Foreign Application Priority Data

Oct. 4, 2002 (KR) ......... 2002-60465 THE SAME

(51) Int. Cl.
*H01L 21/8242* (2006.01)
(52) U.S. Cl. ...................... 438/253; 438/396
(58) Field of Classification Search ............... 438/240, 438/253, 254, 396, 397, 398
See application file for complete search history.

(56) References Cited

U.S. PATENT DOCUMENTS 6,057,190 A   5/2000   Yoshida
6,660,580 B1 *  12/2003  Lee ........................... 438/240

FOREIGN PATENT DOCUMENTS

KR   2001-0061085   7/2001

* cited by examiner

*Primary Examiner*—Hoai Pham
(74) *Attorney, Agent, or Firm*—Volentine Francos & Whitt PLLC

(57) ABSTRACT

Lower electrode contact structures and methods of forming the same provide an interface having a large surface area between a lower electrode and the underlying layers. The lower electrode is in contact with a contact plug and an insulation layer in which the contact plug is buried. At least one supporting layer protrudes upright along the outer peripheral edge of the top surface of the contact plug. The interface between the lower electrode and the underlying layers is thus increased by the supporting layer(s) so that the lower electrode and the underlying layers will solidly adhere to each other.

4 Claims, 12 Drawing Sheets

LOWER ELECTRODE CONTACT STRUCTURE AND METHOD OF FORMING THE SAME

CROSS-REFERENCE TO RELATED APPLICATIONS

This is a divisional of application Ser. No. 10/634,898, filed Aug. 6, 2003, now U.S. Pat. No. 6,861,690, which is incorporated herein by reference in its entirety.

BACKGROUND OF THE INVENTION

1. Field of the Invention

The present invention relates to semiconductor memory devices and to methods of forming the same. More specifically, the present invention relates to the structure of a semiconductor device whereat a lower electrode is disposed over underlying layers and to methods of forming the same.

2. Description of the Related Art

The reduction in line widths of patterned portions of semiconductor devices, as facilitated by improvements in semiconductor device fabricating techniques, is accompanied by decreases in the horizontal dimension and increases in the vertical dimension of various elements of the devices, such as capacitors. The surface area of the lower electrodes of such capacitors directly relates to the capacitance that can be offered by the capacitors. Therefore, a capacitor is formed with a large height so that the lower electrode thereof will have a large surface area, whereby a certain value of capacitance can be provided.

That is, as semiconductor devices become more highly integrated within a chip, the widths of the capacitors are correspondingly reduced. Accordingly, the heights thereof are increased to compensate for the decrease in their width and still provide the same capacitance. As a result, the area of the interface between the lower electrode and the underlying layers is becoming smaller because the interface is determined by the width of the lower electrode. Thus, the adherence of the lower electrode to the underlying layers becomes weaker, so much so that the lower electrode may separate from the underlying layers during the fabricating process. Consequently, adjacent lower electrodes may become electrically connected to each other.

FIG. 1 shows a conventional cylindrical lower electrode structure of a capacitor. Problems posed by the conventional lower electrode structure of a capacitor will be explained with reference to this figure. A contact plug 18 penetrates an insulation layer 12 to electrically connect with an active region (not shown) of a semiconductor substrate 10. A cylindrical lower electrode 28 is disposed on the insulation layer 12 and the contact plug 18. As semiconductor devices become more highly integrated, the width W of the lower electrode 28 tends to decrease and the height H thereof tends to increase. Therefore, an interface area CA decreases where the lower electrode 28 and the underlying layers (i.e., the contact plug 18 and the insulation layer 12) are in contact with each other tends to decrease. Thus, the lower electrode may lean to one side or collapse due to surface tension during a cleaning process carried out after the process of forming the lower electrode. In such a case, adjacent lower electrodes may become electrically connected to each other.

SUMMARY OF THE INVENTION

An object of the present invention is to provide a lower electrode contact structure in which the interface between the lower electrode and the underlying layers is relatively large.

A lower electrode contact structure according to the present invention includes at least one electrode supporting layer protruding above the upper surface of an insulation layer in which a contact plug is buried. The electrode supporting layer(s) extends along the outer periphery of the upper surface of the contact plug. Therefore, the lower electrode conforms to the surface morphology of the insulation layer, the contact plug, and the electrode supporting layer(s). Thus, the area of contact between the lower electrode and the underlying layers (i.e., the layers supporting the lower electrode) is relatively large.

The at least one electrode supporting layer preferably comprises first and second supporting layers. The first supporting layer extends along the outer peripheral edge of the top surface of the contact plug so as to protrude above the top of the insulation layer. The second supporting layer is disposed on a portion of the insulation layer and on the contact plug over inner and outer sidewalls of the first supporting layer.

The contact structure may further comprise a sidewall spacer surrounding the contact plug as interposed between the contact plug and the insulation layer. The first electrode supporting layer is an extension of the sidewall spacer. The first supporting layer and the sidewall spacer may be unitary or discrete. In the case of the latter, the sidewall spacer may be formed of silicon nitride and the first supporting layer may be formed of polysilicon.

The second electrode supporting layer of the contact structure may be formed of silicon nitride.

The contact structure may further comprise an etch stop layer disposed on the insulation layer around the lower electrode. The etch stop layer may be formed of silicon nitride. The thickness of the etch stop layer is identical to that of the second supporting layer.

A lower electrode contact structure may be fabricated according to the present invention as follows.

A contact hole is formed in a lower insulation layer disposed on a semiconductor substrate to expose an active region of the substrate. A sidewall spacer is formed along the sides of the contact hole. Next, a recessed contact plug is formed in the contact hole, i.e., so as to occupy only a portion of the contact hole. A portion of the lower insulation layer is then removed such that a portion of the sidewall spacer protrudes above the resulting upper surface of the lower insulation layer. Finally, a lower electrode of a capacitor is formed on the recessed contact plug, the protruding portion of the sidewall spacer, and that portion of the lower insulation layer that borders the contact hole.

A lower electrode contact structure may also be fabricated according to the present invention as follows.

A contact hole is formed in a lower insulation layer disposed on a semiconductor substrate to expose an active region of the substrate. Next, a recessed contact plug is formed in the contact hole, i.e., so as to occupy only a portion of the contact hole. Then a sidewall spacer is formed above the plug along the upper portion of the contact hole. A portion of the lower insulation layer is then removed such that a portion of the sidewall spacer protrudes above the resulting upper surface of the lower insulation layer. Finally, a lower electrode of a capacitor is formed on the recessed contact plug, the protruding portion of the sidewall spacer, and that portion of the lower insulation layer that borders the contact hole.

In either case, the recessed contact plug is formed by depositing conductive material on the lower insulation layer so as to fill the contact hole, and selectively etching the resulting layer of conductive material with respect to the lower insulation layer and the sidewall spacers until the upper surface of the layer of conductive material becomes situated beneath the level of the upper surface of the insulation layer.

Also, the lower electrode is formed as follows. First, an etch stop layer and an upper insulation layer are sequentially formed on top of the recessed contact plug, the protruding portion of the sidewall spacer, and the lower insulation layer. The upper insulation layer is patterned to form an opening aligned with the recessed contact plug, the sidewall spacer, and a portion of the lower insulation layer that borders the contact hole. The etch stop layer exposed through the opening is etched back. Then, an electrode material layer is formed along the bottom and sides of the opening. A protecting insulation layer is formed on the electrode material layer so as to fill what remains of the opening therethrough. The protecting insulation layer and the electrode material layer are planarized (etched) until the upper surface of the upper insulation layer is exposed.

DETAILED DESCRIPTION OF THE PREFERRED EMBODIMENTS

Figure 1:
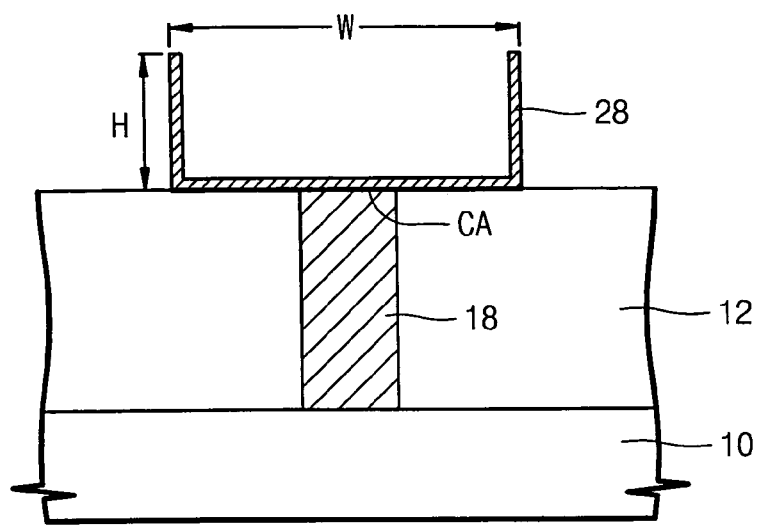
FIG. 1 is a schematic cross-sectional view of a conventional lower electrode structure of a semiconductor device, comprising a lower electrode of a capacitor.

The present invention will now be described more fully hereinafter with reference to the accompanying drawings, throughout which like numbers designate like elements. Also, only one lower electrode is illustrated in the drawings for clarity.

Figure 2:
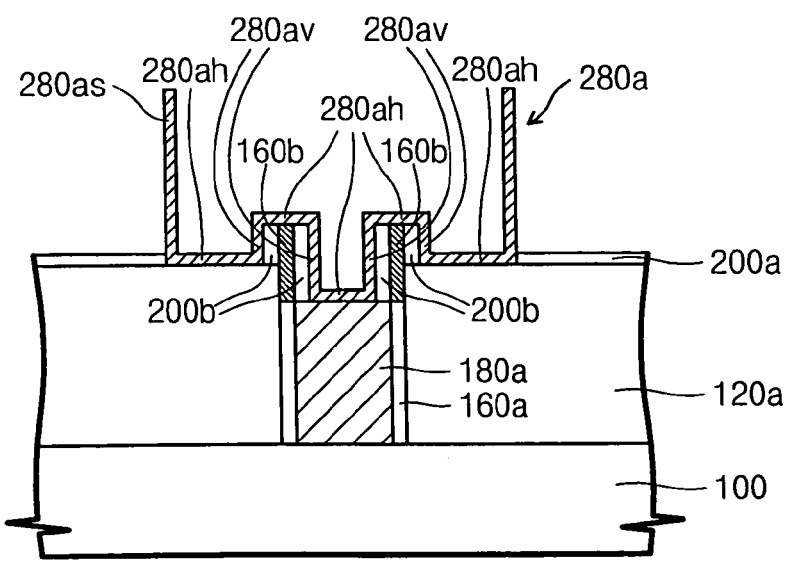
FIG. 2 is a schematic cross-sectional view of an embodiment of a lower electrode contact structure in accordance with the present invention.

Referring first to FIG. 2, a contact plug 180a penetrates an insulation layer 120a to connect with an active region of a semiconductor substrate 100. The insulation layer 120a surrounds the contact plug 180a. In the drawing, the contact plug 180a is shown as having an upper surface disposed beneath that of the insulation layer 120a. However, the contact plug 180a may project above the insulation layer 120a or may have an upper surface that is coplanar with that of the insulation layer 120a. Sidewall (insulation) spacers 160a are interposed between the contact plug 180a and the insulation layer 120a. The sidewall spacers 160a may be of a material having an etch selectivity with respect to the insulation layer 120a. For example, the insulation layer 120a is a silicon oxide layer and the sidewall spacers 160a are formed of silicon nitride.

A first supporting layer 160b extends from the sidewall spacers 160a to protrude over the tops of the insulation layer 120a and the contact plug 180a. The first supporting layer 160b may be unitary with the sidewall spacers 160a. That is to say, the first supporting layer 160b may be formed of the same material as the sidewall spacers 160a.

A second supporting layer 200b is disposed on inner and outer sidewalls of the exposed first supporting layer 160b. The first and second supporting layers 160b and 200b together compose a structure for supporting a lower electrode 280a.

The lower electrode 280a is disposed in contact with the contact plug 180a, the supporting layers 160b and 200b, and a portion of the insulation layer 120a around the contact plug 180a. Therefore, the bottom of the lower electrode 280a has a configuration corresponding to the contour of this underlying structure, i.e., the area presented by the contact plug 180a, the supporting layers 160b and 200b, and the insulation layer 120a.

Specifically, the lower electrode 280a comprises a sidewall 280 as and a bottom wall that is contiguous with the sidewall 280 as and contacts the underlying structure. The bottom wall of the lower electrode 280a is dented by the underlying structure. That is, the bottom wall of the lower electrode 280a comprises parallel horizontal parts 280ah disposed on the insulation layer 120a, the contact plug 180a, and on top surface of the supporting layers 160b and 200b, and vertical parts 280av disposed on sidewalls of the supporting layers 160b and 200b and contiguous with the parallel horizontal parts 280ah. As a result, the interface area between the lower electrode 280a and the underlying structure is larger compared to that in a conventional contact structure, by an amount corresponding to the contact areas defined by the vertical parts 280av.

An etch stop layer 200a is disposed on the insulation layer 120a. The etch stop layer 200a may be formed of the same material and may have practically the same thickness as the second supporting layer 200b.

The interface area between the lower electrode and the underlying layers of the lower electrode contact structure is relatively large so that the lower electrode tends to remain adhered to the underlying layers. That is, the underlying layers stably support the lower electrode. Accordingly, there is little possibility of the lower electrode coming into contact with the lower electrode of an adjacent capacitor.

Figure 3:
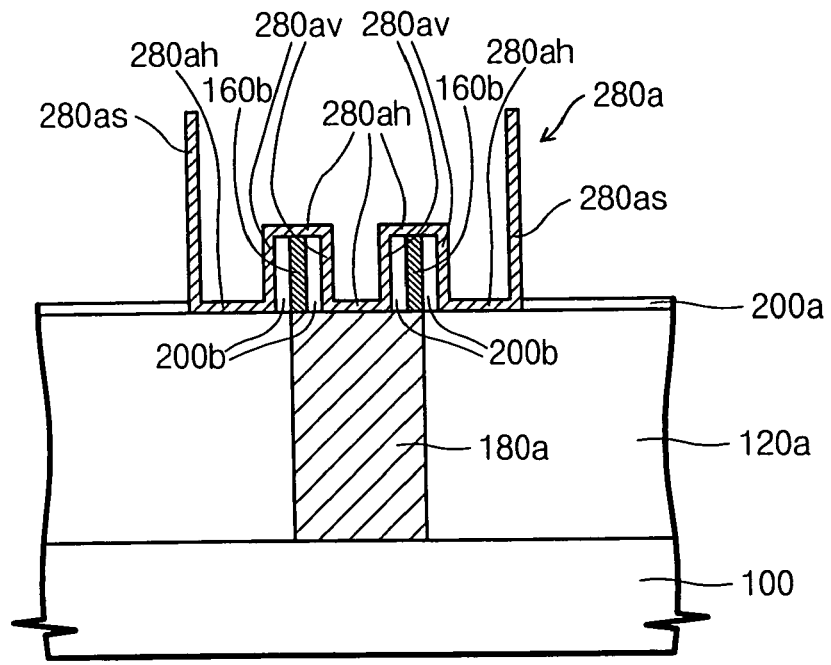
FIG. 3 is a schematic cross-sectional view of another embodiment of a lower electrode contact structure in accordance with the present invention.

FIG. 3 shows another embodiment of a lower electrode contact structure in accordance with the present invention. This contact structure is identical with the contact structure of FIG. 2 except for the insulation spacers. In this case, the first supporting layer 160b may be formed of silicon nitride or a conductive material, for example, polysilicon.

In this embodiment, a contact plug 180a extends through the entirety of an insulation layer 120 so as to connect to an active region of a semiconductor substrate 100. A first supporting layer 160b extends along the outer peripheral edge of the top surface of the contact plug 180a as protruding above the insulation layer 120a and the contact plug 180a. A second supporting layer 200b is disposed on inner and outer sidewalls of the first supporting layer 160b. A lower electrode 280a is disposed on the insulation layer 120a, the contact plug 180a and the supporting layers 160b and 200b.

A method of forming the lower electrode contact structure shown in FIG. 2 will be explained hereinafter with reference to FIGS. 4A–4K. The subsequent processes, such as a device isolation process, a MOSFET process, and a bit line process are conventional per se and as such, will be omitted from the following detailed description.

Figure 4A:
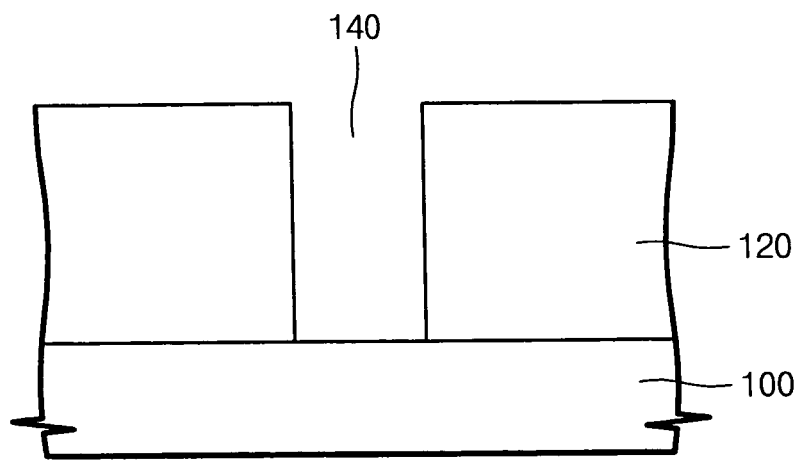
FIGS. 4A–4K are schematic cross-sectional views showing a method of forming the contact structure of FIG. 2.

Referring now to FIG. 4A, an insulation layer 120 is formed on a semiconductor substrate 100. The insulation layer 120 may be formed of, for example, silicon oxide. The insulation layer 120 is patterned to form a contact hole 140 exposing the active region (not shown) of the semiconductor substrate 100. Therefore, the contact hole 140 has a bottom defined by the active region and sides defined by the insulation layer 120.

Figure 4B:
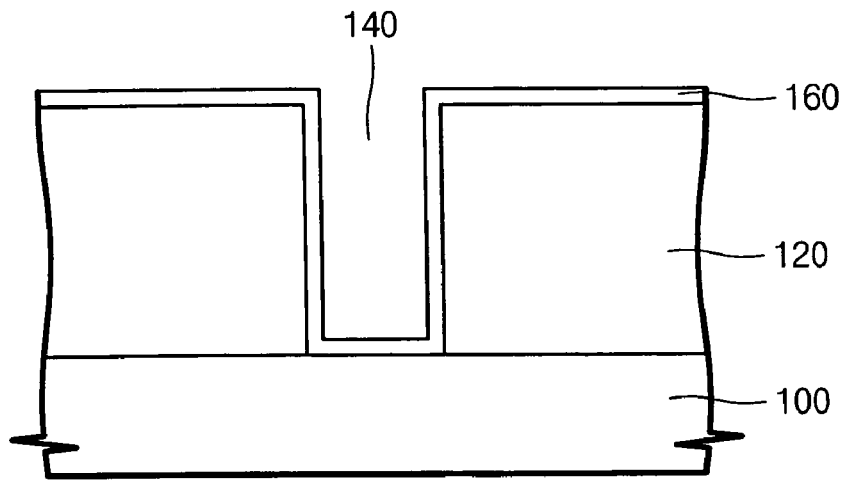

Referring to FIG. 4B, a material layer having an etch selectivity with respect to the insulation layer 120, for example, a silicon nitride layer 160, is formed on the sides and bottom of the contact hole 140 and on a top surface of the insulation layer 120 with a substantially uniform thickness.

Figure 4C:
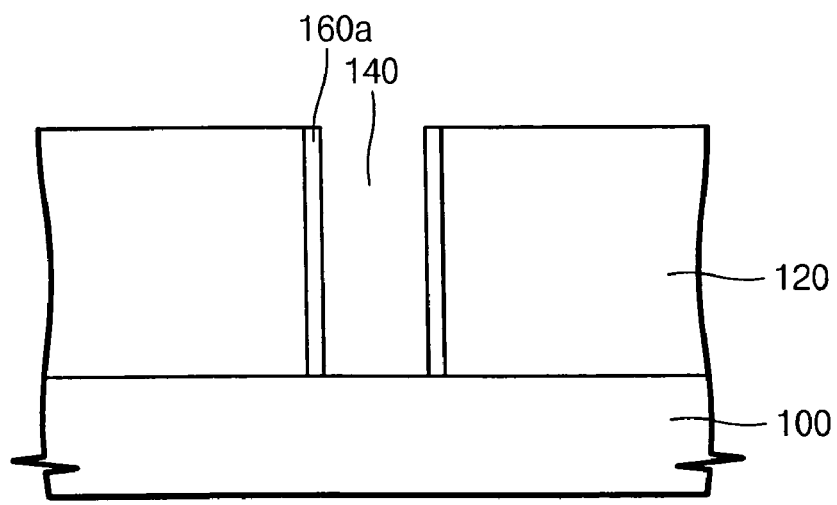

Referring to FIG. 4C, an etch back process is performed on the resultant structure. Portions of the silicon nitride layer 160 are removed from the bottom of the contact hole 140 and the top surface of the insulation layer 120 so that a portion of the layer 160 remains only along the sides of the contact hole 140. Thus, sidewall (insulation) spacers 160a are formed along the sides of the contact hole 140.

Figure 4D:
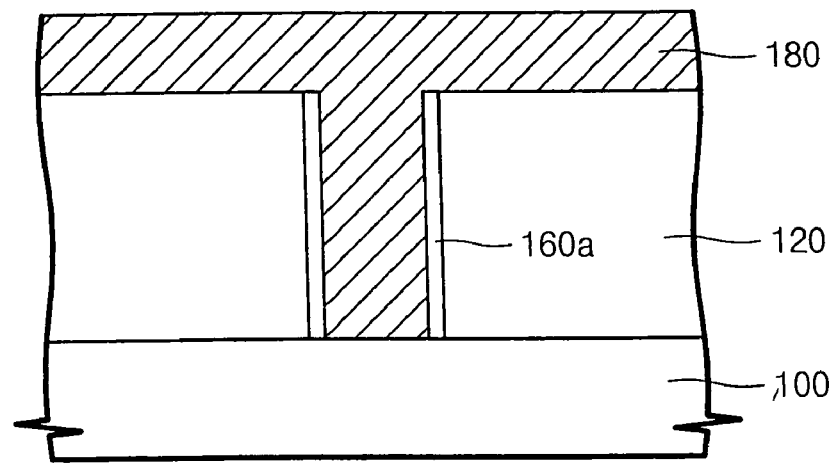

Referring to FIG. 4D, a plug conductive material layer 180 is formed on the resultant structure to fill the contact hole 140. The conductive material layer 180 has an etch selectivity with respect to the sidewall spacers 160a.

Figure 4E:
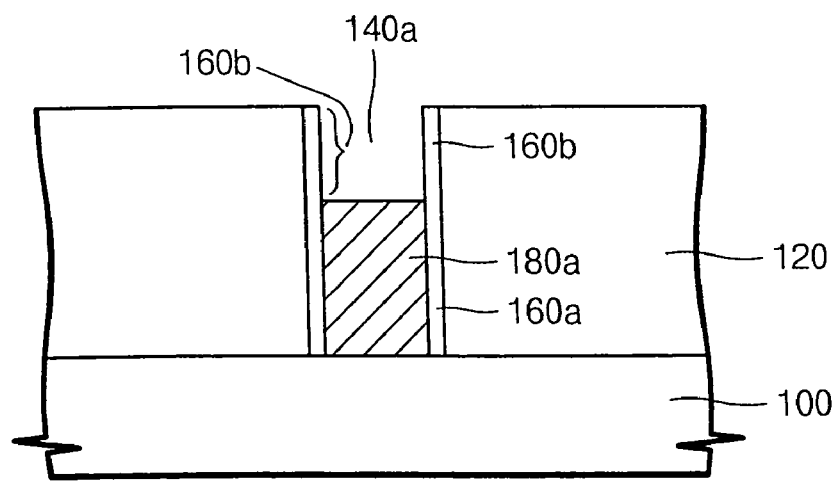

Referring to FIG. 4E, the conductive material layer 180 is etched to form a recessed contact plug 180a filling only a portion of the contact hole 140. In other words, the top of the contact plug 180a is situated beneath the top of the insulation layer 120, such that an upper part of the contact hole 140a remains empty. The insulation layer 160 is divided into two parts 160a, 160b located to either side of the top surface of the recessed contact plug 180. The upper part 160b of the insulation layer, i.e., that part of the sidewall spacers disposed along the upper portion of the contact hole 140a, will be referred to hereinafter as "a first supporting layer".

Figure 4F:
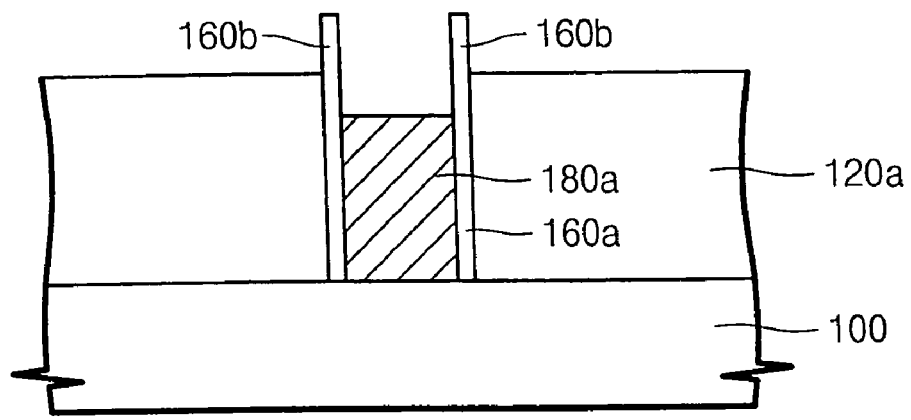

Referring to FIG. 4F, the insulation layer 120 is etched. The etching may be carried out until the top surface of the insulation layer 120a becomes coplanar with the top surface of the contact plug 180a, or becomes disposed at a level lower or higher than that of the upper surface of the contact plug 180a. In any case, inner and outer sidewalls of the first supporting layer 160b are exposed. The first supporting layer 160b protrudes from a top surface of the etched insulation layer 120a.

Figure 4G:
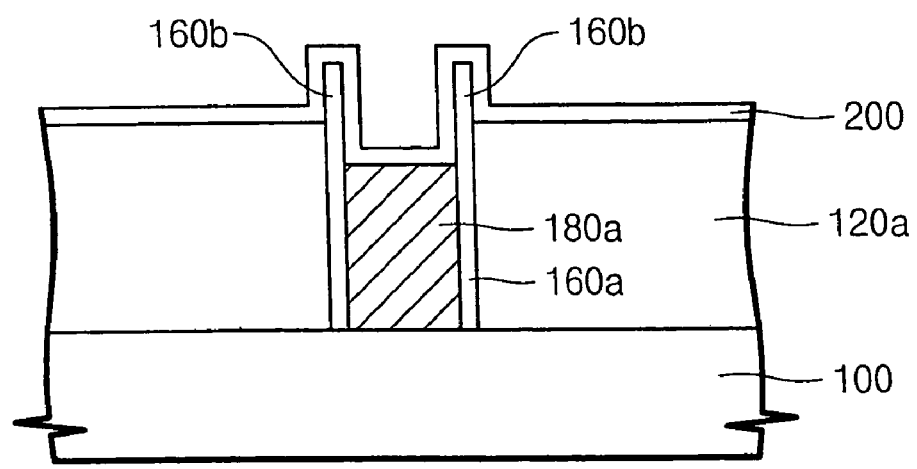

Referring to FIG. 4G, an etch stop layer 200 is formed on the insulation layer 120a, the contact plug 180a, and the first supporting layer 160b. The etch stop layer 200 plays a role in stopping the etching in a subsequent process of patterning a sacrificial insulation layer. In addition, a portion of the etch stop layer 200 supports the lower electrode together with the first supporting layer 160b, as will be explained in more detail below.

Figure 4H:
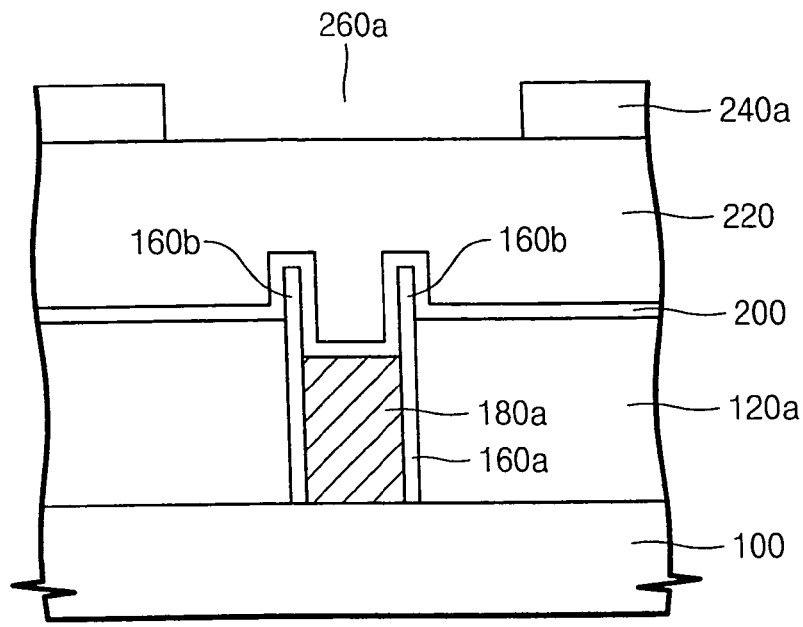

Referring to FIG. 4H, a sacrificial insulation layer 220 that determines the height of the lower electrode is formed on the etch stop layer 200. A photoresist pattern 240a is formed on the sacrificial insulation layer 220. The photoresist pattern 240a has an opening 260a therethrough. The opening 260a establishes the width of the lower electrode.

Figure 4I:
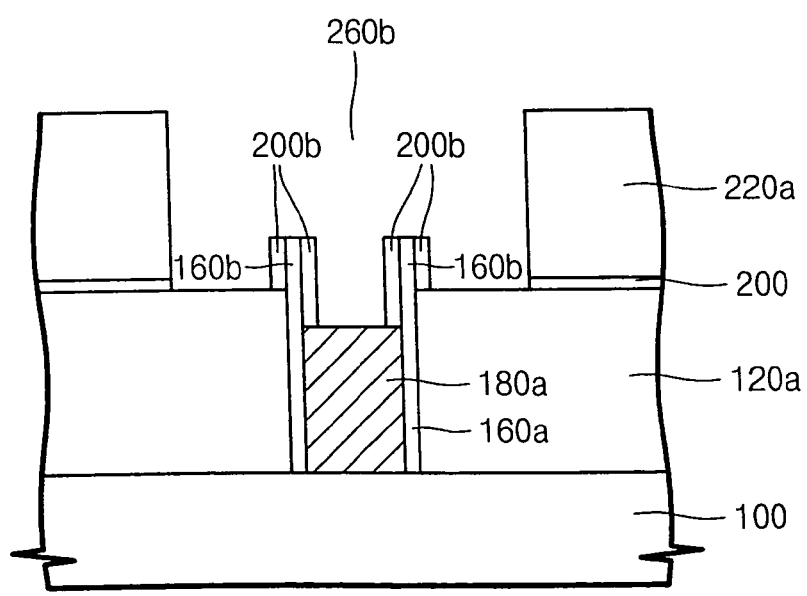

Referring to FIG. 4I, the sacrificial insulation layer 220 exposed by the opening 260a of the photoresist pattern 240 is etched using the photoresist pattern 240a as an etch mask. The etch stop layer 200 serves to stop the etching process. Therefore, a trench 260b is formed in the sacrificial insulation layer 220a. The trench 260b has a width corresponding to that of the opening 260a defined by the photoresist pattern 240a. The photoresist pattern 240a is then removed.

Subsequently, the etch stop layer 200 exposed by the trench 260b is etched back. Thus, the tops of the contact plug 180a, the insulation layer 120a, and the first supporting layer 160b are exposed and a portion of the etch stop layer remains on inner and outer sidewalls of the first supporting layer 160b to constitute a second supporting layer 200b.

Figure 4J:
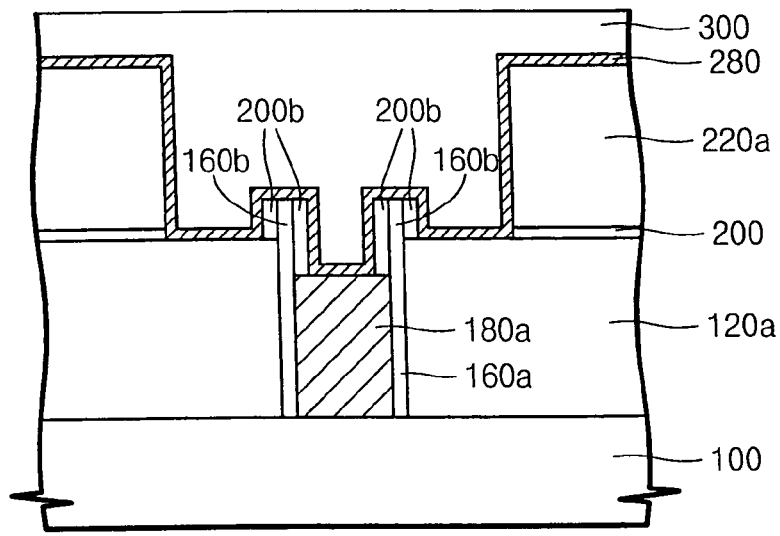

Referring to FIG. 4J, a lower electrode conductive layer 280 is formed along the sacrificial insulation layer 220a, the exposed portion of the insulation layer 120a, the contact plug 180a, and the supporting layers 200b and 160b. The lower electrode conductive layer 280 has a uniform thickness. Subsequently, a protecting insulation layer 300 is formed on the lower conductive layer 280 to fill the entire trench 260.

Figure 4K:
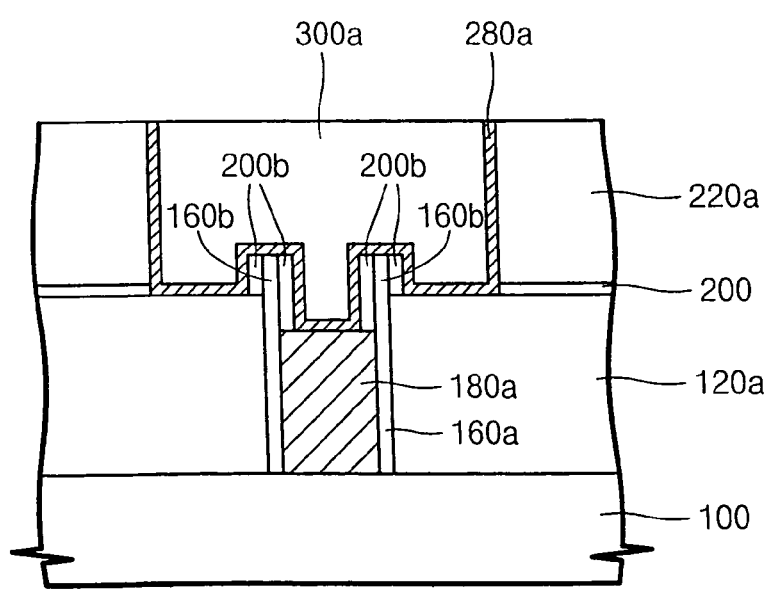

Referring to FIG. 4K, the protecting insulation layer 300 and the conductive layer 280 are planarized (etched) to expose the top surface of the sacrificial insulation layer 220a. Therefore, a lower electrode 280a is formed which is electrically isolated from the adjacent lower electrode(s).

The residual protecting insulation layer 300a and the sacrificial insulation layer 220a are removed to expose inner and outer sidewalls and a bottom wall of the lower electrode 280a, as illustrated in FIG. 2. In this case, the lower electrode 280a is firmly supported by the underlying structure, such that the lower electrode 280a will not collapse or lean to one side during the removal of the insulation layers 300a and 220a.

A dielectric layer and an electrode conductive layer are formed on the exposed lower electrode 280a to complete the capacitor.

Subsequently, conventional fabricating processes including a metal interconnection process, a passivation process and the like are performed.

A method of fabricating the contact structure shown FIG. 3 will be explained hereinafter with reference to FIGS. 5A–5I.

Figure 5A:
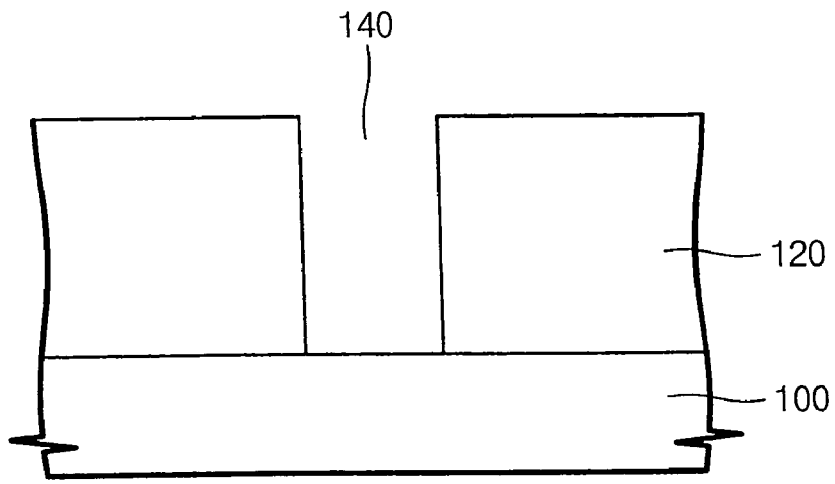
FIGS. 5A–5I are schematic cross-sectional views showing a method of forming the contact structure of FIG. 3.

Referring first to FIG. 5A, an insulation layer 120 is formed on a semiconductor substrate 100. The insulation layer 120 is then patterned to form a contact hole 140 exposing an active region of the semiconductor substrate 100.

Figure 5B:
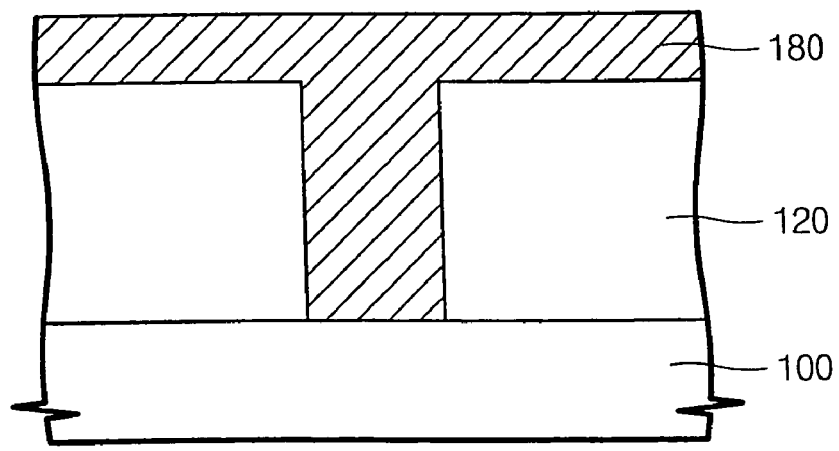

Referring to FIG. 5B, a plug conductive material layer 180 is formed on the insulation layer 120 to fill the entire contact hole 140.

Figure 5C:
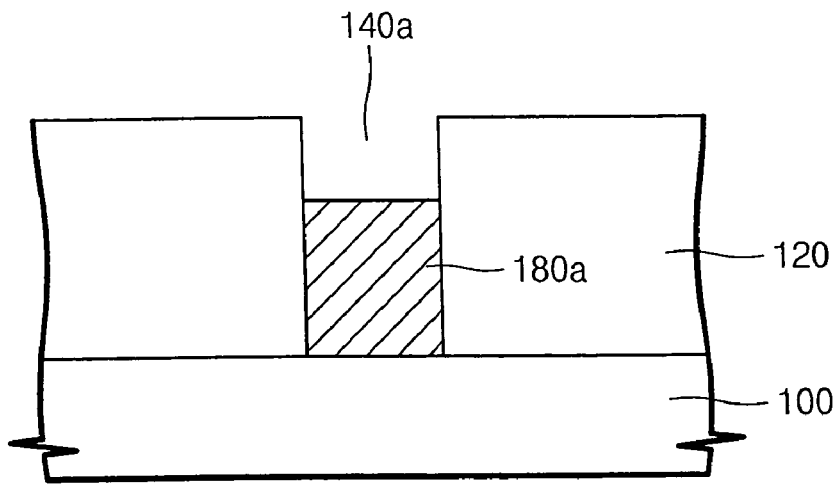

Referring to FIG. 5C, the conductive material layer 180 is etched to form a recessed contact plug 180a, i.e., a plug whose upper surface is situated beneath the top of the insulation layer 120. That is, conductive material is removed from the upper part of contact hole 140 such that the resulting recessed contact plug 180a occupies only a lower part of the contact hole 140.

Figure 5D:
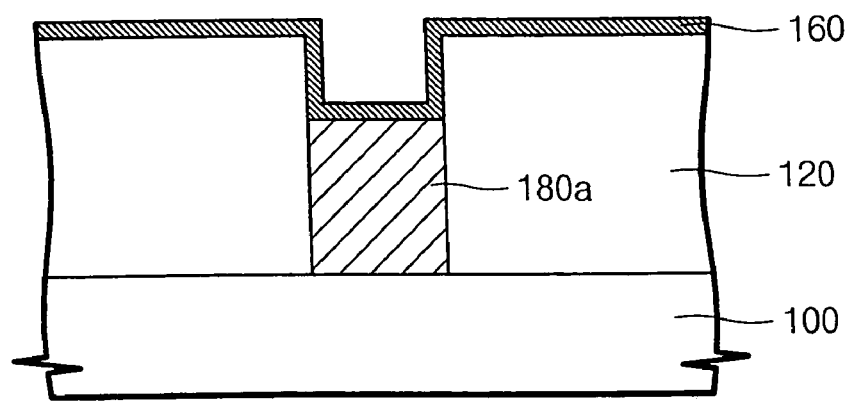

Referring to FIG. 5D, a supporting layer 160 is formed on sides and bottom of the upper part of the contact hole 140a and on top of the insulation layer 120. The supporting layer 160 is formed of material having an etch selectivity with respect to the insulation layer 120, for example, silicon nitride, polysilicon or the like. The supporting layer 160 is conformal with respect to the underlying insulation layer 120 and the contact plug 180a.

Figure 5E:
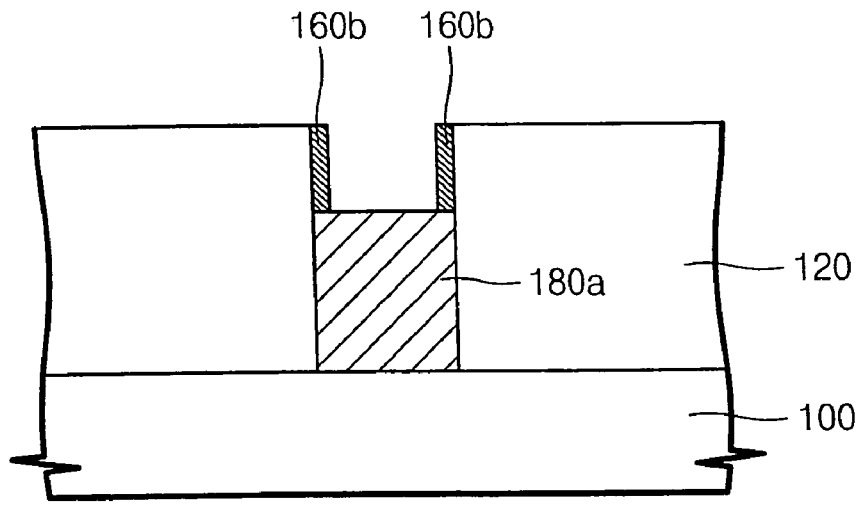

Referring to FIG. 5E, an etch back process is carried out on the supporting layer 160 to remove the supporting layer from the tops of the contact plug 180a and the insulation layer 120. The supporting layer 160 is left only along the upper portion of the sides of the contact hole 140a to form a first supporting layer 160b.

Figure 5F:
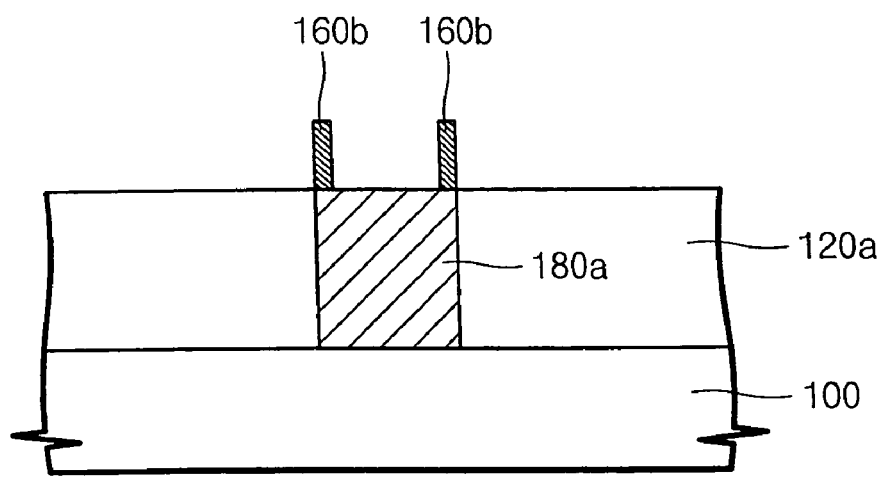
Figure 5G:
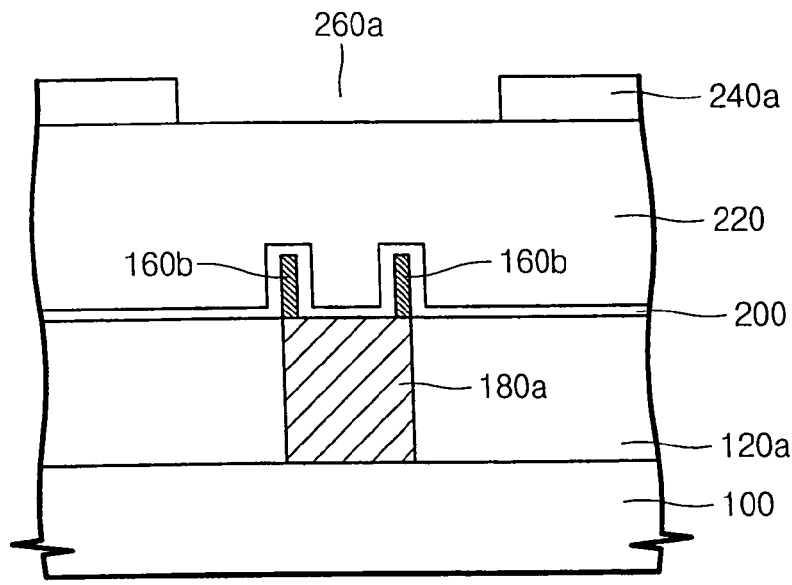

Referring to FIG. 5F, an etch back process is carried out on the insulation layer 120 to remove a portion of the insulating layer, thereby reducing the thickness thereof. As a result, the first supporting layer 160b protrudes in a vertical direction beyond the tops of the etched insulation layer 120a and the contact plug 180a.

The remaining steps are performed in the same way as in the method described above. Briefly, referring to FIG. 5G, an etch stop layer 200 is formed on the contact plug 180a, the insulation layer 120a, and the first supporting layer 160b. Next, a sacrificial insulation layer 220 and a photoresist pattern 240a are formed on the etch stop layer 200.

Figure 5H:
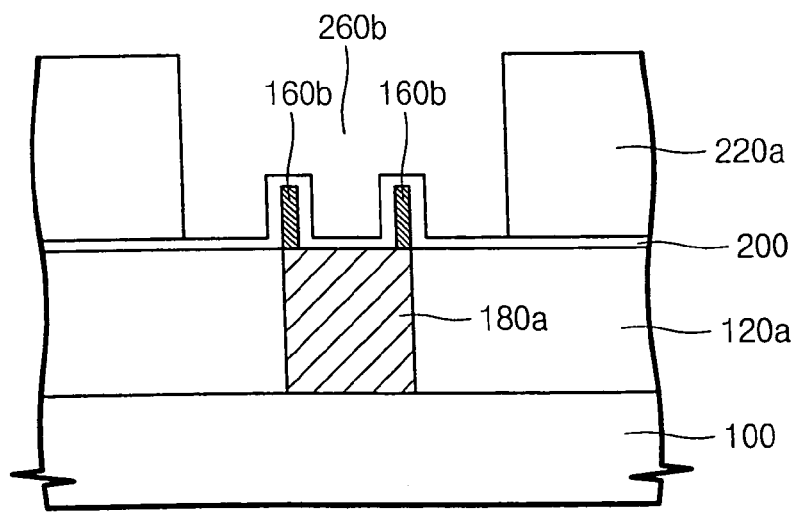

Referring to FIG. 5H, a sacrificial insulation layer 220 exposed by the opening 260a defined by the photoresist pattern 240a is etched using the photoresist pattern 240a as an etch mask. Therefore, a trench 260b delimiting the shape of a lower electrode is formed in the sacrificial insulating layer 220a. At this time, the etch stop layer 200 serves as an etch stop for the process of etching the sacrificial insulation layer 220.

Figure 5I:
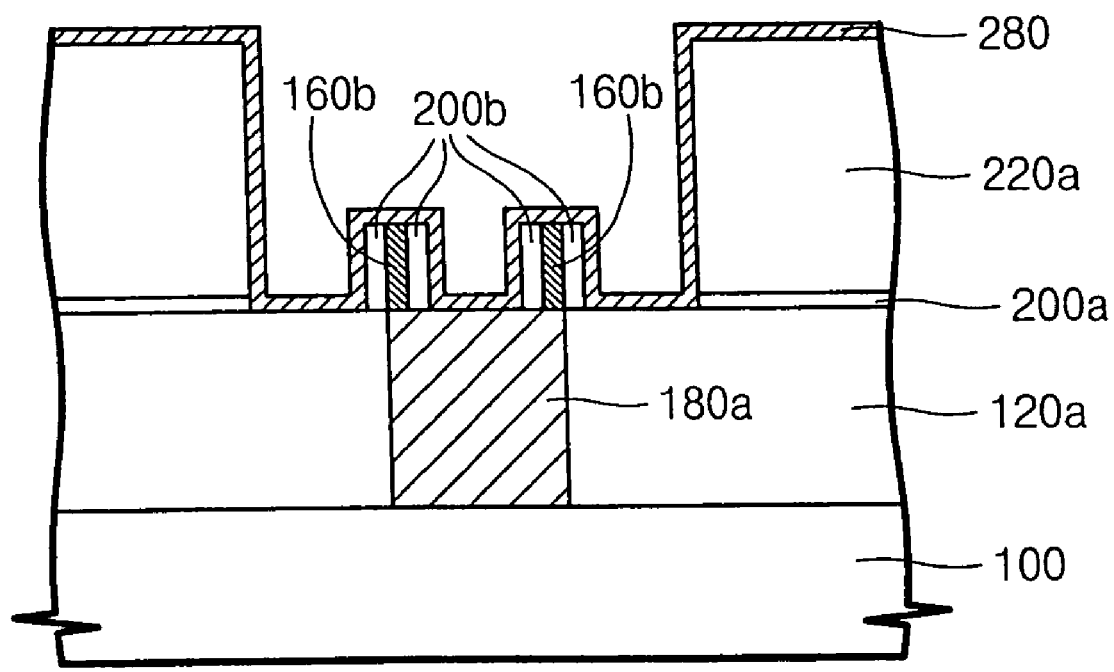

Referring to FIG. 5I, the exposed etch stop layer 200 is etched back. Therefore, the etch stop layer on top of the contact plug 180a and the insulation layer 120a is removed. Thus, the etch stop layer is left only on inner and outer sidewalls of the first supporting layer 160b to form a second supporting layer 200b. Subsequently, a lower electrode conductive layer 280 is formed on the exposed contact plug 180a, the supporting layers 160b and 200b, the insulation layer 120a, and the sacrificial insulation layer 220a. The subsequent processes are performed in the same way as described in connection with the method shown in FIGS. 4J and 4K.

In the methods described above, the lower electrode is formed as a hollow cylinder. However, the lower electrode may be formed as a solid cylinder. That is, a trench is formed in the upper sacrificial insulation layer, and a layer of conductive material is deposited on the resulting structure to fill the trench. Then, the sacrificial insulation layer may be removed. In this case, a protecting insulation layer is not necessary.

According to the methods described above, the sidewall spacers and a portion of the etch stop layer are formed to protrude above the contact plug and to thereby support the lower electrode. Also, the interface between the lower electrode and underlying layers is relatively large, such that the lower electrode and underlying layers can strongly adhere to one another. Therefore, the underlying layers stably support the lower electrode. In addition, the interface between the lower electrode and the dielectric layer of the capacitor is correspondingly large. Consequently, the capacitor may provide a greater capacitance than a conventional capacitor of the same width.

Finally, although the present invention has been described in connection with the preferred embodiments thereof, various changes and modifications may be made thereto without departing from the true spirit and scope of the invention as defined by the appended claims.

What is claimed is:

1. A method of forming a lower electrode contact structure of a capacitor, said method comprising:
    forming a contact hole through a lower insulation layer disposed on a semiconductor substrate having an active region so as to expose the active region;
    providing an insulating material on the sides of the contact hole to thereby form a sidewall spacer;
    forming a recessed contact plug in the contact hole and which plug occupies only a lower portion of the contact hole;
    removing a portion of the lower insulation layer until the resulting upper surface thereof is situated beneath the level of an upper portion of the sidewall spacer, whereby the upper portion of the sidewall spacer protrudes above the resulting upper surface of the lower insulation layer; and
    subsequently forming a lower electrode of a capacitor on the recessed contact plug, on said portion of the sidewall spacer protruding above the upper surface of the lower insulation layer, and on a portion of the upper surface of the lower insulation layer that borders the contact hole.

2. The method of claim 1, wherein said forming of the recessed contact plug comprises:
    forming a layer of conductive material on the lower insulation layer so as to fill the contact hole; and
    selectively etching the layer of conductive material with respect to the lower insulation layer and the sidewall spacer so as to lower the upper surface of the layer of conductive material beneath the level of the upper surface of the insulation layer.

3. The method of claim 1, wherein said forming of the lower electrode comprises:
    sequentially forming an etch stop layer and an upper insulation layer on top of the recessed contact plug, the sidewall spacer, and the lower insulation layer;
    patterning the upper insulation layer to form an opening aligned with the recessed contact plug, the sidewall spacer, and the portion of the upper surface of the lower insulation layer that borders the contact hole;
    etching back the etch stop layer exposed by said opening;
    forming an electrode material layer at the bottom and along the sides of said opening and on the upper insulation layer;
    forming a protecting insulation layer on the electrode material layer so as to fill the opening;
    planarizing the protecting insulation layer and the electrode material layer until the upper insulation layer is exposed; and
    subsequently removing the remainder of the protecting insulation layer and the upper insulation layer.

4. The method of claim 3, wherein the sidewall spacer and the etch stop layer are formed of silicon nitride.

* * * * *